United States Patent
Yamada et al.

(10) Patent No.: US 7,550,786 B2
(45) Date of Patent: Jun. 23, 2009

(54) COMPOUND SEMICONDUCTOR EPITAXIAL SUBSTRATE

(75) Inventors: Hisashi Yamada, Tsukuba (JP); Takenori Osada, Chiba (JP); Noboru Fukuhara, Tsukuba (JP)

(73) Assignees: Sumitomo Chemical Company, Limited, Tokyo (JP); Sumika Epi Solution Company, Ltd., Tokyo (JP)

( * ) Notice: Subject to any disclaimer, the term of this patent is extended or adjusted under 35 U.S.C. 154(b) by 448 days.

(21) Appl. No.: 10/554,706

(22) PCT Filed: Apr. 7, 2004

(86) PCT No.: PCT/JP2004/005016

§ 371 (c)(1),
(2), (4) Date: Oct. 27, 2005

(87) PCT Pub. No.: WO2004/097924

PCT Pub. Date: Nov. 11, 2004

(65) Prior Publication Data

US 2006/0255367 A1    Nov. 16, 2006

(30) Foreign Application Priority Data

Apr. 28, 2003   (JP) .............................. 2003-124374

(51) Int. Cl.
*H01L 29/739* (2006.01)
*H01L 31/072* (2006.01)

(52) U.S. Cl. ................ 257/197; 257/190; 257/198

(58) Field of Classification Search ................ 257/197, 257/198, 190, 200, E21.371, E21.387, E29.033
See application file for complete search history.

(56) References Cited

U.S. PATENT DOCUMENTS 5,332,451 A * 7/1994 Hata et al. ................. 148/33.2
6,046,464 A * 4/2000 Schetzina ................... 257/96

FOREIGN PATENT DOCUMENTS

| JP | 2000-315692 A | 11/2000 |
|----|---------------|---------|
| JP | 2002-25922 A  | 1/2002  |
| JP | 2002-280545 A | 9/2002  |

* cited by examiner

*Primary Examiner*—Hung Vu
(74) *Attorney, Agent, or Firm*—Sughrue Mion, PLLC

(57) ABSTRACT

A compound semiconductor epitaxial substrate including a substrate, and a sub-collector layer, a collector layer, a base layer, an emitter layer and a contact layer(s) formed in this order on the substrate, the compound semiconductor epitaxial substrate having an oxygen-containing layer between the substrate and the sub-collector layer.

4 Claims, 3 Drawing Sheets

COMPOUND SEMICONDUCTOR EPITAXIAL SUBSTRATE

TECHNICAL FIELD

The present invention relates to a compound semiconductor epitaxial substrate, and more specifically, relates to a compound semiconductor epitaxial substrate suitable for manufacturing a hetero-junction bipolar transistor.

BACKGROUND ART

A hetero-junction bipolar transistor (hereafter referred to as HBT in some cases) is a bipolar transistor wherein the emitter-base junction is made a hetero-junction using a substance having a larger band gap than the base layer for the emitter layer in order to enhance the emitter injection efficiency, and is suitable as a semiconductor element used in the frequency region of the microwave band or higher.

For example, in the case of a GaAs HBT, a compound semiconductor epitaxial substrate wherein a p-n junction, which is an emitter-base junction, is the structure of the hetero-junction, is generally produced by sequentially crystal-growing an $n^+$-GaAs layer (sub-collector layer), an n-GaAs layer (collector layer), a p-GaAs layer (base layer), an n-AlGaAs layer or an n-InGaP layer (emitter layer), and an n-GaAs layer (sub-emitter layer) on a semi-insulating GaAs substrate, using a metal organic chemical vapor deposition process (MOCVD process). HBT is manufactured using the compound semiconductor epitaxial substrate. In addition to these, a compound semiconductor epitaxial substrate for an HBT using an InP substrate is also widely used.

FIG. 3 is a diagram showing the pattern of the layer structure of a conventional commonly used GaAs HBT. In the HBT 100, a sub-collector layer 102 consisting of $n^+$-GaAs, a collector layer 103 consisting of n-GaAs, a base layer 104 consisting of p-GaAs, an emitter layer 105 consisting of n-InGaP or n-AlGaAs, a sub-emitter layer 106 consisting of $n^+$-GaAs, and an emitter contact layer 107 consisting of $n^+$-InGaAs are formed in this order as semiconductor thin film crystalline layers on a semi-insulating GaAs substrate 101 using an appropriate vapor phase growing process, such as an MOCVD process. A collector electrode 108 is formed on the sub-collector layer 102, base electrodes 109 are formed on the base layer 104, and an emitter electrode 110 is formed on the emitter contact layer 107.

In thus constituted HBT, the current gain β is represented by the equation:

$$\beta = Ic/Ib = (In - Ir)/(Ip + Is + Ir)$$

wherein Ic represents a collector current, Ib represents a base current, In represents an electron injecting current from the emitter to the base, Ip represents a hole injecting current from the base to the emitter, Is represents an emitter/base interface recombination current, and Ir represents a recombination current in the base.

Therefore, in order to enhance the current gain β, from the above equation, the recombination current Ir in the base must be reduced. Although the recombination current in the base is significantly affected by the crystallinity of the base layer, it is also significantly affected by the crystallinity of the sub-collector layer, and the crystallinity of the substrate used for growing. With the lowering of these crystallinities, the current gain β is also lowered.

Therefore, the current gain β of the HBT functional layers formed on the substrate is affected by the dislocation density of the substrate, there is a problem in that the fluctuation of electrical characteristics of the HBT is caused by the kind of the substrate to be used even if the same manufacturing process is applied. In order to solve this problem, methods for forming a buffer layer on the substrate have been heretofore proposed. For example, in the case of a GaAs substrate, there has been proposed a constitution wherein a GaAs or AlGaAs lattice structure, or a GaAs/AlGaAs super-lattice structure is formed in the buffer layer, thereby preventing the propagation of defects present in the substrate into the epitaxial layer formed on the substrate.

However, by the constitution wherein the above-described lattice structure or super-lattice structure is formed in the buffer layer, the current gain characteristics still fluctuate depending on the kind of the substrate to be used, probably because the propagation of defects in the substrate into the epitaxial layer formed thereon cannot be sufficiently suppressed. Therefore, a compound semiconductor epitaxial substrate that can obtain stable electrical characteristics in manufacturing not depending on the fluctuation by lots, the crystallinity or the like of the substrate has been demanded. It is also demanded to manufacture a device having favorable current gain characteristics without being affected by the defects in the substrate.

DISCLOSURE OF THE INVENTION

The object of the present invention is to provide a compound semiconductor epitaxial substrate that can solve the above-described problems in the background art.

In order to solve the above-described problems, in the present invention, in a compound semiconductor epitaxial substrate wherein a buffer layer, a sub-collector layer, a collector layer, a base layer and an emitter layer are formed on a substrate, an oxygen-containing layer is formed between the substrate and the sub-collector layer, and the propagation of defects existing in the substrate is suppressed by the oxygen-containing layer. Thereby, the fluctuation of the current gain characteristics of the HBT can be improved, and the HBT characteristics can be enhanced. In addition, a compound semiconductor epitaxial substrate that can obtain stable device characteristics not depending on the kinds of the substrate can be provided.

According to a first embodiment of the present invention, there is provided a compound semiconductor epitaxial substrate comprising a substrate, and a sub-collector layer, a collector layer, a base layer, an emitter layer and a contact layer(s) formed in this order on the substrate, the compound semiconductor epitaxial substrate having an oxygen-containing layer between the substrate and the sub-collector layer.

According to a second embodiment of the present invention, there is provided the compound semiconductor epitaxial substrate according to the first aspect, wherein the oxygen-containing layer is an $Al_xGa_{1-x}As$ ($0 \leq x \leq 1$) layer.

According to a third embodiment of the present invention, there is provided the compound semiconductor epitaxial substrate according to the second aspect, wherein the oxygen-containing layer has an oxygen concentration of $1 \times 10^{16}$ cm$^{-3}$ or more.

According to a fourth embodiment of the present invention, there is provided the compound semiconductor epitaxial substrate according to the second aspect, wherein the oxygen-containing layer has an oxygen concentration of $1\times10^{16}$ cm$^{-3}$ or more and $1\times10^{21}$ cm$^{-3}$ or less.

BEST MODE FOR CARRYING OUT THE INVENTION

Figure 1:
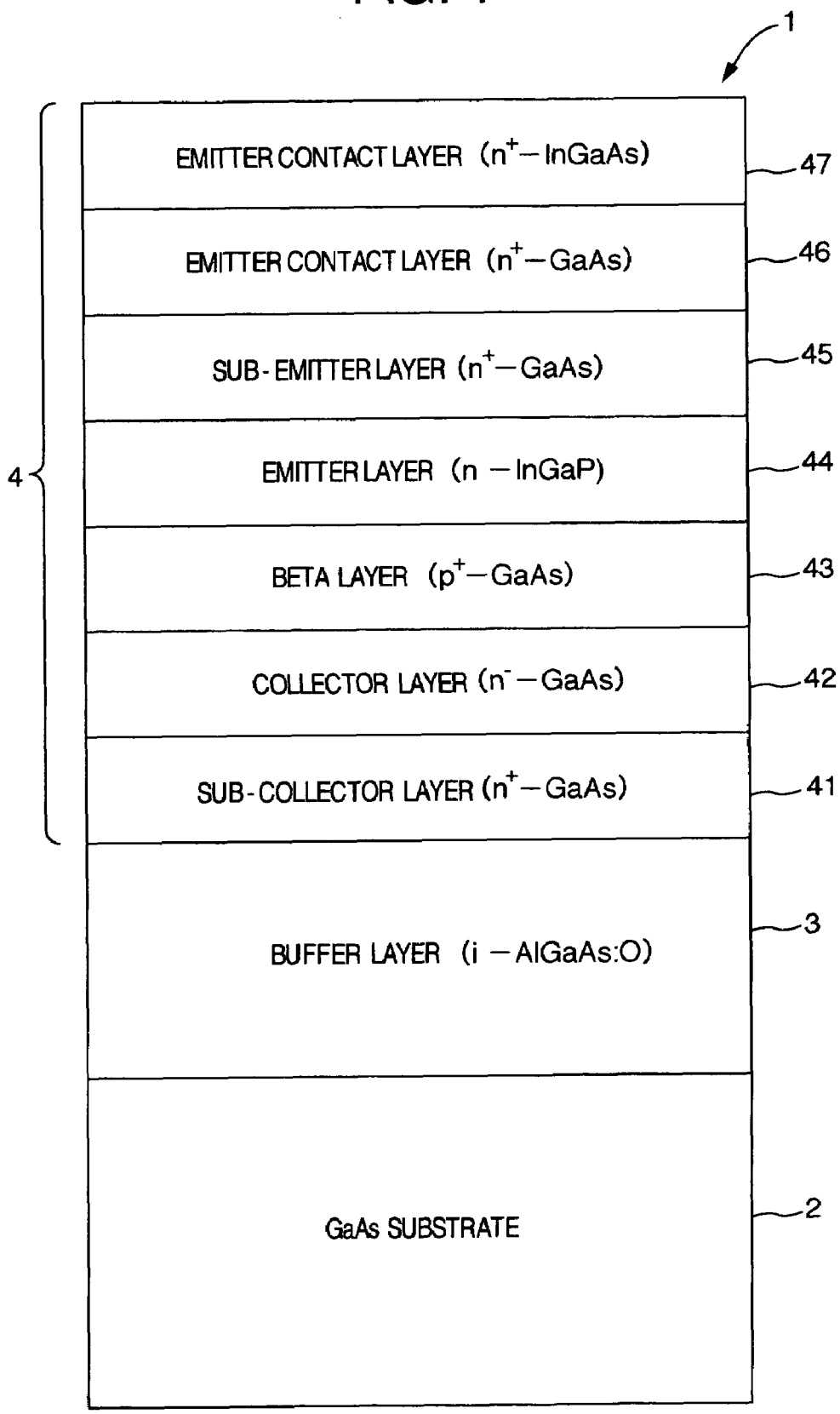
FIG. 1 is a layer structure diagram showing the pattern of an embodiment of a compound semiconductor epitaxial substrate according to the present invention.

An example of the embodiments of the present invention will be described in detail referring to the drawings.

FIG. 1 is a layer structure diagram showing the pattern of an example of the embodiments of the present invention. FIG. 1 shows a compound semiconductor epitaxial substrate used as a thin-film crystalline wafer for manufacturing a GaAs HBT.

The structure of the compound semiconductor epitaxial substrate 1 shown in FIG. 1 is as follows: The compound semiconductor epitaxial substrate 1 is constituted by sequentially laminating a plurality of semiconductor thin-film crystal growth layers on a GaAs substrate 2 ((001) face in FIG. 1) composed of semi-insulating GaAs single crystals using an MOCVD process. The process for producing the compound semiconductor epitaxial substrate in the present invention is not limited to the MOCVD process used in this embodiment, but a liquid-phase epitaxial growth process, a molecular-beam epitaxial process, a chemical beam epitaxial process, an atomic layer epitaxial process or the like can also be used.

A buffer layer 3 containing oxygen is formed on the GaAs substrate 2. The buffer layer 3 is formed as a single crystalline layer of a compound semiconductor represented by a general formula $Al_xGa_{1-x}As$ ($0 \leq x \leq 1$) using an MOCVD process in this embodiment. In this embodiment, the composition value of Al in the buffer layer 3 is 0.3. The oxygen concentration in the buffer layer 3 is about $1\times10^{19}$ cm$^{-3}$ in atomic concentration. Any process can be used as a process for doping oxygen into the buffer layer 3. For example, a process wherein oxygen gas diluted by hydrogen or an inert gas is supplied into a reaction furnace when the buffer layer 3 is formed; or a process wherein an oxide film is previously formed on a GaAs substrate 2 by ozone treatment before growing the buffer layer 3, and then the buffer layer 3 is grown, can also be used. Although the examples of oxygen doping materials other than oxygen gas include ethers, nitrogen oxides, alcohols, carbon dioxide and carbon monoxide, the materials are not limited thereto, but any substance can be used as long as the substance contains oxygen that can be incorporated into the crystals.

The HBT functional layers 4 are formed on the buffer layer 3 as an AlGaAs layer containing oxygen. On the buffer layer 3, an n$^+$-GaAs layer that functions as a sub-collector layer 41, and an n$^-$-GaAs layer that functions as a collector layer 42 are sequentially formed each in a predetermined thickness as compound semiconductor epitaxially grown crystal layers. On the collector layer 42, a p$^+$-GaAs layer that functions as a base layer 43 is formed also as a compound semiconductor epitaxially grown crystal layer. On the base layer 43, an n-InGaP layer that functions as an emitter layer 44 is formed; and on the emitter layer 44, an n$^+$-GaAs layer is formed as a sub-emitter layer 45, and an n$^+$-GaAs layer and an n$^+$-InGaAs layer are formed as emitter contact layers 46 and 47, respectively. The above-described HBT functional layers 4 are the collective term for these layers 41 to 47.

It is not necessary that only the AlGaAs layer containing oxygen is the buffer layer, but for example, when a plurality of buffer layers are formed between the GaAs substrate 2 and the sub-collector layer 41, if at least one of a GaAs layer containing oxygen, an AlGaAs layer containing oxygen, and a layer containing planar-added oxygen is formed among a plurality of layers, they can be deemed as buffer layers 3.

A process for forming each of the above-described layers as an epitaxially grown semiconductor thin-film crystalline layer using an MOCVD process will be described in detail.

Figure 2:
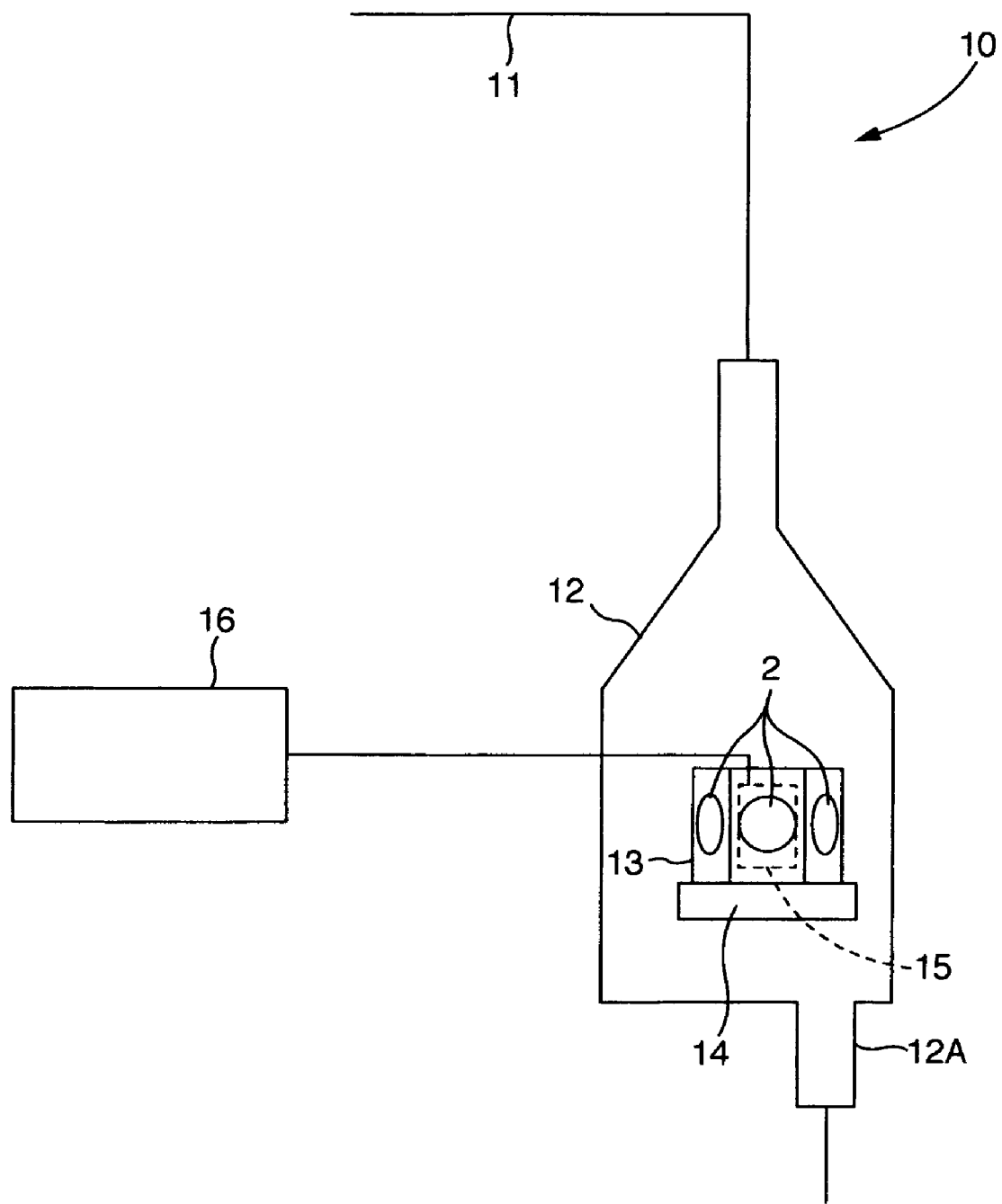
FIG. 2 is a diagram showing the pattern of the major part of a vapor-phase grown semiconductor producing apparatus used for producing the compound semiconductor epitaxial substrate shown in FIG. 1.
Figure 3:
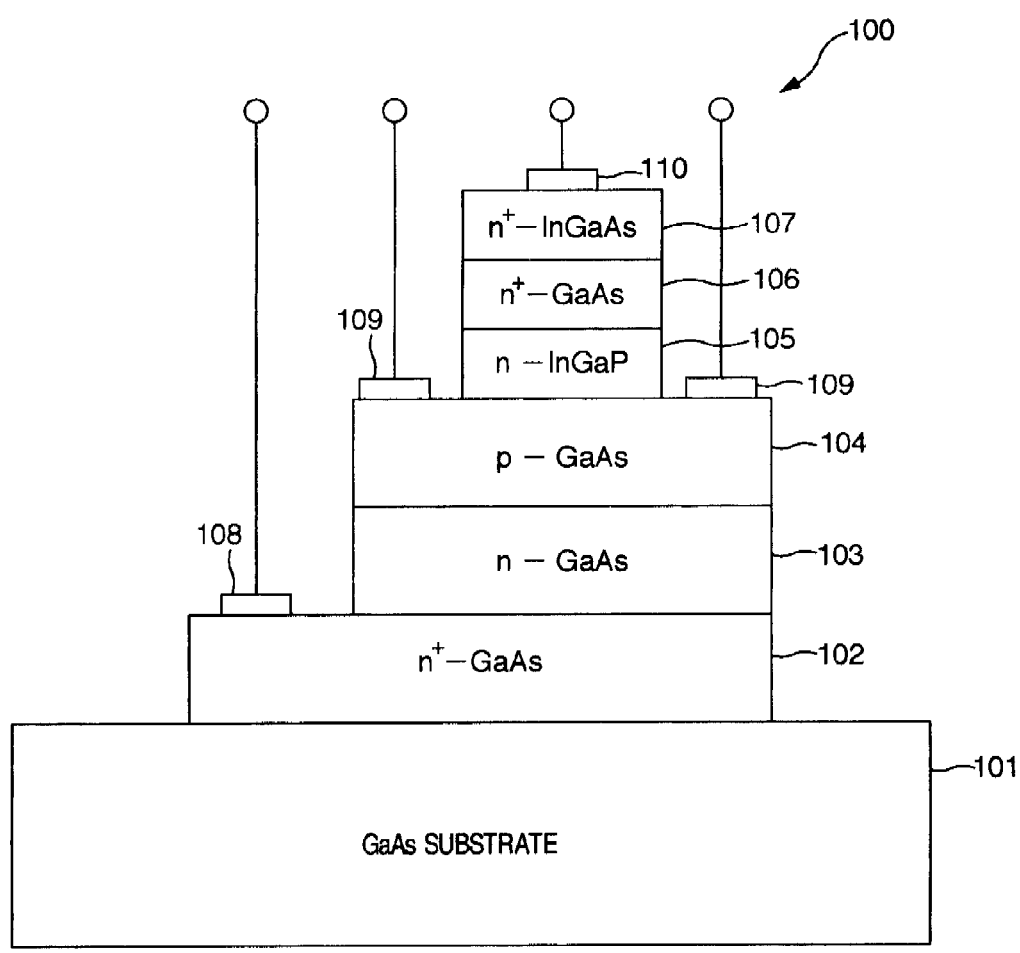
FIG. 3 is a diagram showing the pattern of the layer structure of a conventional commonly used GaAs HBT.

FIG. 2 schematically shows the major part of a vapor-phase grown semiconductor producing apparatus 10 used for producing the compound semiconductor epitaxial substrate 1 shown in FIG. 1 using an MOCVD process. The vapor-phase grown semiconductor producing apparatus 10 is equipped with a reactor 12 to which a material gas from a material supply system (not shown) is supplied through a material supply line 11. A susceptor 13 for holding and heating a GaAs substrate 2 is installed in the reactor 12. In this embodiment, the susceptor 13 is a polygonal prismatic body, and a plurality of GaAs substrates 2 are held on the surface. The susceptor 13 has a well known structure wherein the susceptor 13 can be rotated by a rotating device 14. In the susceptor 13, an infrared lamp denoted by the reference numeral 15 is installed to heat the susceptor 13. By allowing a current for heating to flow from a power source for heating 16 to the infrared lamp 15, the GaAs substrate 2 can be heated to a required growing temperature. By this heating, the material gas supplied in the reactor 12 through the material supply line 11 is thermally decomposed on the GaAs substrate 2, and a desired compound semiconductor thin film crystal can be grown in a vapor phase on the GaAs substrate 2. The consumed gas is discharged outwardly from an exhaust port 12A, and transferred to exhaust gas treatment equipment.

Here, what is used as a GaAs substrate is a semi-insulating GaAs single crystalline substrate preferably produced by an LEC (liquid encapsulated Czochralski) process, a VB (vertical Bridgeman) process, a VGF (vertical gradient freezing) process or the like. In any case of these producing processes, although it is preferred to prepare a substrate having a gradient of about 0.05° to 10° from a crystallographic plain orientation, the process is not limited thereto.

After degreasing, cleaning, etching, water-washing and drying the surface of a GaAs single crystalline substrate prepared as described above, the GaAs single crystalline substrate is placed as a GaAs substrate 2 on the susceptor 13 in the reactor 12. Then, after the gas in the reactor 12 is sufficiently replaced by high-purity hydrogen, heating is started. When the reaction furnace is stabilized at an adequate temperature, an oxygen-added AlGaAs layer of a thickness of 30 nm is grown on the GaAs substrate 2 at 640° C. to form a buffer layer 3 using hydrogen as the carrier gas, arsine as the material for a group V element, trimethyl gallium (TMG) and trimethyl aluminum (TMA) as the materials for group III elements, and ether as the material for oxygen, at 640° C.

On the oxygen-added buffer layer 3, a sub-collector layer 41 and a collector layer 42 are grown at a growing temperature of 640° C. Further on the collector layer 42, a base layer 43, an emitter layer 44 and a sub-emitter layer 45 are grown at a growing temperature of 620° C., and on the sub-emitter layer 45, emitter-contact layers 46 and 47 are formed.

In the compound semiconductor epitaxial substrate 1, since the buffer layer 3, which is an AlGaAs layer containing oxygen, is formed as an oxygen-containing layer between the GaAs substrate 2 and the sub-collector layer 41, when compound semiconductor single crystalline thin-film layers are sequentially laminated on the GaAs substrate 2 using an MOCVD process, the propagation of the defects, such as dislocation, present in the GaAs substrate 2 to the sub-collector layer 41 can be effectively suppressed by the buffer layer 3, which is an oxygen-containing layer.

The present inventors consider the reason why the propagation of the defects in the GaAs substrate 2 can be suppressed by oxygen contained in the buffer layer 3 as follows: Since oxygen has a large electron affinity and electrically attracts a trap, the diffusion of defects, such as dislocation, succeeded from the GaAs substrate 2 during the growth of the buffer layer 3 can be effectively suppressed. In addition, since the ion radius of oxygen is small, which produces local strain around oxygen atoms in a layer containing oxygen, and easily traps defects, the diffusion of defects, such as dislocation, succeeded from the GaAs substrate 2 during the growth of the buffer layer 3 can be effectively suppressed.

As a result, since many of defects succeeded from the GaAs substrate 2 are terminated in the buffer layer 3, the effect of defects in the GaAs substrate 2 can be minimized during the formation of the HBT functional layer 4, and the crystallinity of the base layer 43 can be significantly improved. Thereby, the recombination current in the base layer can be reduced, the fluctuation of the current gains of the HBT can be significantly improved compared with the case of using a conventional buffer layer that contains no oxygen, and the HBT characteristics can be improved. In addition, even if the succession of defects, such as dislocation, are present in the GaAs substrate 2, the succession of these defects into the HBT functional layer 4 can be suppressed, and favorable and stable device characteristics that do not depend on the kind of the GaAs substrate 2 can be realized, helping the improvement of yield.

In the above-described embodiment, although the case wherein the compound semiconductor epitaxial substrate 1 is fabricated using an MOCVD process is described, the present invention is not limited to this process, but other suitable processes can be also used. For example, various vapor-phase growing process, such as a molecular beam epitaxy process (MBE process) can also be used. Although ether is used as a material for adding oxygen to AlGaAs when the buffer layer 3 is formed, the material for adding oxygen is not limited to ether, but materials other than the above material can be also used as long as the material can incorporate oxygen into the crystal. These can be used alone or in combination. In conventional processes, the GaAs substrate is used after removing the natural oxide film by etching the substrate; however, in the present invention, the naturally occurring oxide film is purposely used as an oxygen source without etching to incorporate oxygen into the buffer layer 3.

The larger the Al composition value x in $Al_xGa_{1-x}As$ ($0 \leq x \leq 1$) of the buffer layer 3, the more the quantity of oxygen incorporation. Therefore, the effect of the defects of the GaAs substrate 2 can be reduced by enlarging the Al composition value, and the crystallinity of the base layer 43 can be improved. However, if the Al composition value is excessively high, AlGaAs becomes unstable and easily oxidized. The Al composition value x is preferably $0.1 < x < 0.8$, and more preferably $0.2 \leq x \leq 0.7$.

In the present invention, an InP substrate can be also used in place of the GaAs substrate. In the case of a compound semiconductor epitaxial substrate for an HBT wherein an InP substrate is used in place of the GaAs substrate, an $In_yAl_{1-y}As$ ($0 \leq y \leq 1$) layer can be used. Above all, the use of an $In_{0.52}Al_{0.48}As$ layer that is lattice-matched to the InP substrate is preferred.

By adding oxygen to the buffer layer consisting of an $In_yAl_{1-y}As$ layer, the same operation and effect as in the case of the embodiment shown in FIG. 1 can be achieved. In this case also, the oxygen-containing InAlAs layer may not be necessarily a buffer layer, and it is sufficient that an oxygen-containing layer in an adequate form is formed between the InP substrate and the sub-collector layer formed thereon. The oxygen concentration or the like in this case is substantially the same as described above.

The range of the oxygen concentration in the buffer layer 3 is normally $1\times10^{16}$ cm$^{-3}$ or more, preferably $1\times10^{17}$ cm$^{-3}$ or more, and more preferably $1\times10^{18}$ cm$^{-3}$ or more. If the oxygen concentration is less than $1\times10^{16}$ cm$^{-3}$, the effects exerted by the present invention tend to lower. On the other hand, if excessive oxygen deteriorates conditions of the surface of the epitaxial layer grown on the buffer layer 3; therefore, the upper limit of oxygen concentration is preferably $1\times10^{21}$ cm$^{-3}$ or less, and more preferably $1\times10^{20}$ cm$^{-3}$ or less.

The present invention will be further specifically described below referring to examples and comparative examples; however, the present invention is in no way limited thereto.

EXAMPLE 1

A compound semiconductor epitaxial substrate having a structure shown in FIG. 1 was fabricated as follows: A GaAs substrate having a defect density of 5000/cm$^2$ was prepared, and a buffer layer of $Al_{0.3}Ga_{0.7}As$ of a thickness of 30 nm was grown on the GaAs substrate. At this time, ether was used as an oxygen supply source, and the oxygen concentration of the buffer layer was $1\times10^{19}$ cm$^{-3}$. HBT functional layers were formed on the buffer layer using an MOCVD process.

The thickness, in composition and the like were as follows: The emitter contact layer 47 was composed of an n$^+$-InGaAs layer, the In composition was 0.5, the film thickness was 50 nm, and the carrier concentration was $2.0\times10^{19}$ cm$^{-3}$. The emitter contact layer 46 was composed of an n$^+$-InGaAs layer, and the In composition was continuously varied from 0 at the boundary with the sub-emitter layer 45 to 0.5 at the boundary with the emitter contact layer 47, the film thickness was 50 nm, and the carrier concentration was $2.0\times10^{19}$ cm$^3$. The sub-emitter layer 45 was composed of an n$^+$-GaAs layer, the film thickness was 100 nm, and the carrier concentration was $3.0\times10^{18}$ cm$^{-3}$. The emitter layer 44 was composed of an n-InGaP layer, the In composition was 0.48, the film thickness was 30 nm, and the carrier concentration was $3.0\times10^{17}$ cm$^{-3}$. The base layer 43 was composed of a p$^+$-GaAs layer, the film thickness was 80 nm, and the carrier concentration was $4.0\times10^{19}$ cm$^{-3}$. The collector layer 42 was composed of an n$^-$-GaAs layer, the film thickness was 700 nm, and the carrier concentration was $5.0\times10^{15}$ cm$^3$. The sub-collector layer 41 was composed of an n$^+$-GaAs layer, the film thickness was 500 nm, and the carrier concentration was $3.0\times10^{18}$ cm$^{-3}$.

An HBT element was fabricated using the thus obtained compound semiconductor epitaxial substrate. The emitter size was 100 μm×100 μm. The current gain β of the HBT element was measure to be 141. In this embodiment, the current gain β was the collector current/base current when the collector current was flowed at 1 kA/cm$^2$.

EXAMPLE 2

An HBT element was fabricated in the same manner as in Example 1, except that the defect density of the GaAs substrate used was 3000 to 4000/cm$^2$. The current gain β was measure to be 141.

EXAMPLE 3

An HBT element was fabricated in the same manner as in Example 1, except that the defect density of the GaAs substrate used was 3000 to 4000/cm$^2$, and the formation of a naturally occurring oxide film was suppressed. The current gain β was measure to be 141.

COMPARATIVE EXAMPLE 1

An HBT element was fabricated by using a substrate of the same kind of substrate as the GaAs substrate used in Example 1, growing a buffer layer of a thickness of 30 nm consisting of AlGaAs that contains no oxygen on the substrate, and fabricating a compound semiconductor epitaxial substrate wherein HBT functional layers were formed in the same manner as in Example 1. The current gain β of the HBT element was measure to be 128.

COMPARATIVE EXAMPLE 2

An HBT element was fabricated by using a substrate of the same kind of substrate as the GaAs substrate used in Example 2, growing a buffer layer of a thickness of 30 nm consisting of AlGaAs that contains no oxygen on the substrate, and fabricating a compound semiconductor epitaxial substrate wherein HBT functional layers were formed in the same manner as in Example 2. The current gain β of the HBT element was measure to be 126.

COMPARATIVE EXAMPLE 3

An HBT element was fabricated by using a substrate of the same kind of substrate as the GaAs substrate used in Example 3, growing a buffer layer of a thickness of 30 nm consisting of AlGaAs that contains no oxygen on the substrate, and fabricating a compound semiconductor epitaxial substrate wherein HBT functional layers were formed in the same manner as in Example 3. The current gain β of the HBT element was measure to be 117.

The results of Examples 1 to 3 and Comparative Examples 1 to 3 showed that the current gains were low when the buffer layer contained no oxygen, and became various values depending on the substrate to be used. This shows that the device characteristics became unstable depending on the crystallinity of the substrate. The present inventors consider that the defect density of the substrate most affects the current gain among the parameters representing the crystallinity of the substrate. The result also showed that when an oxygen-containing layer was formed, the current gain was large when any substrates were used, and did not depend on the kind of the substrate. The present inventors consider that the oxygen-containing layer plays a role to suppress the propagation of defects present in the substrate to the epitaxial layer, resulting in the improvement of the crystallinity of the base layer, and a significant enhancement of the current gain.

INDUSTRIAL APPLICABILITY

According to the present invention, by forming an oxygen-containing layer between a substrate and a sub-collector layer, the propagation of defects present in the substrate can be suppressed, and favorable and stable HBT characteristics can be obtained without depending on the kind of the substrate. In addition, by the suppression of defect propagation, the current gain can be enhanced.

The invention claimed is:

1. A compound semiconductor epitaxial substrate comprising a substrate, and a sub-collector layer, a collector layer, a base layer, an emitter layer and a contact layer(s) formed in this order on said substrate,
   wherein said compound semiconductor epitaxial substrate has an oxygen-containing layer between said substrate and said sub-collector layer, and said oxygen-containing layer has an oxygen concentration of $1 \times 10^{16}$ cm$^{-3}$ or more and $1 \times 10^{21}$ cm$^{-3}$ or less.

2. A compound semiconductor epitaxial substrate comprising a substrate, and a sub-collector layer, a collector layer, a base layer, an emitter layer and a contact layer(s) formed in this order on said substrate,
   wherein said compound semiconductor epitaxial substrate has an oxygen-containing layer between said substrate and said sub-collector layer and said oxygen-containing layer is an Al$_x$Ga$_{1-x}$As ($0 \leq x \leq 1$) layer.

3. The compound semiconductor epitaxial substrate according to claim 2, wherein said oxygen-containing layer has an oxygen concentration of $1 \times 10^{16}$ cm$^{-3}$ or more.

4. The compound semiconductor epitaxial substrate according to claim 2, wherein said oxygen-containing layer has an oxygen concentration of $1 \times 10^{16}$ cm$^{-3}$ or more and $1 \times 10^{21}$ cm$^{-3}$ or less.

* * * * *